United States Patent [19]
Kobayashi et al.

[11] Patent Number: 5,291,171
[45] Date of Patent: Mar. 1, 1994

[54] MAGNET APPARATUS SUITABLE FOR MAGNETIC RESONANCE IMAGING

[75] Inventors: Nobutaka Kobayashi; Ken Ohashi; Koji Miyata, all of Fukui, Japan

[73] Assignee: Shin-Etsu Chemical Co., Ltd., Tokyo, Japan

[21] Appl. No.: 991,225

[22] Filed: Dec. 16, 1992

[30] Foreign Application Priority Data

Dec. 17, 1991 [JP] Japan .................................. 3-353211

[51] Int. Cl.⁵ .......................... H01F 7/02; H01F 3/00
[52] U.S. Cl. ..................................... 335/306; 335/297
[58] Field of Search ............................. 335/302–306, 335/296

[56] References Cited

U.S. PATENT DOCUMENTS

| | | | |
|---|---|---|---|
| 4,644,313 | 2/1987 | Miyajima | 335/296 |
| 4,672,346 | 6/1987 | Miyamoto et al. | 335/296 |
| 4,695,802 | 9/1987 | Zijlstra | 324/319 |
| 4,777,464 | 10/1988 | Takabatashi et al. | 335/306 |
| 4,816,796 | 3/1989 | Miyajima et al. | 335/306 |
| 4,818,966 | 4/1989 | Miyamoto et al. | 335/296 |
| 4,943,774 | 7/1990 | Breman et al. | 324/318 |
| 5,003,276 | 3/1991 | Sarwinski | 335/304 |
| 5,089,798 | 2/1992 | Miyata | 335/211 |

OTHER PUBLICATIONS

T. Miyamoto et al *IEEE Transactions on Magnetics*, "A Development of A Permanent Magnet Assembly for MRI Devices Using Nd–Fe–B Material", vol. 25, No. 5, Sep. 1989, pp. 3907–3909.

*Primary Examiner*—Leo P. Picard
*Assistant Examiner*—Raymond Barrera
*Attorney, Agent, or Firm*—Lowe, Price, LeBlanc & Becker

[57] ABSTRACT

The invention relates to an apparatus for producing a magnetic field in a space between two oppositely arranged permanent magnet discs, which is suitable for use in magnetic resonance imaging (MRI). An object of the invention is to reduce the size and weight of the yoke connecting the two permanent magnet discs without causing magnetic saturation of the yoke in view of the fact that magnetic saturation of the yoke leads to the appearance of leakage flux and consequential lowering of the uniformity of the magnetic field. The object is accomplished by regulating the cross-sectional area of the whole magnetic path in the yoke, $A_y$, such that the following equation holds: $A_y = 1/a \times A_m B_m / B_{ys}$, where $A_m$ is the cross-sectional area of magnetic path in each permanent magnet disc, $B_m$ is the magnetic flux density in each permanent magnet disc at normal temperature, $B_{ys}$ is the saturation magnetic flux density of the yoke at normal temperature, and a is a coefficient the value of which is not larger than 1 and not smaller than 0.6.

4 Claims, 3 Drawing Sheets

MAGNET APPARATUS SUITABLE FOR MAGNETIC RESONANCE IMAGING

BACKGROUND OF THE INVENTION

This invention relates to an apparatus for producing a magnetic field in a space between two oppositely arranged permanent magnets, which is suitable for use in magnetic resonance imaging (MRI).

For producing a magnetic field for MRI, a conventional apparatus uses a pair of permanent magnet discs which are held at a suitable distance from each other by a yoke such that a pole face of one magnet disc faces the opposite pole face of the other. To produce a uniform magnetic field in a cylindrical space between the two permanent magnet discs, a disc-like pole piece is placed on the aforementioned pole face of each permanent magnet disc. The pole piece is made of a ferromagnetic material such as soft iron and has an annular protuberance in a peripheral region.

For practical applications of the above described magnet apparatus it is desirable to reduce the size and weight of the whole apparatus, and to meet the desire it is effective to reduce the size and weight of the yoke. However, there is a problem that as the size and weight of the yoke are substantially reduced it is likely that the uniformity of the magnetic field in the apparatus is degraded by the appearance of leakage flux which is attributed to magnetic saturation of the yoke. When much care is taken to prevent the occurrence of magnetic saturation it becomes difficult to considerably reduce the size and weight of the yoke.

SUMMARY OF THE INVENTION

The present invention relates to a magnet apparatus of the above described type, and an object of the invention is to reduce the size and weight of the yoke to a satisfactory extent without inducing magnetic saturation that becomes a cause of lowering of the uniformity of a magnetic field in the apparatus.

The present invention provides a magnet apparatus suitable for MRI, the apparatus having a pair of permanent magnet discs each of which is magnetized in the direction of thickness, a yoke which connects the two permanent magnet discs and holds the permanent magnet discs parallel and opposite to each other such that a pole face of one of the permanent magnet discs faces the opposite pole face of the other and a pair of disc-like pole pieces which are placed on the opposite pole faces of the two permanent magnet discs, respectively, so as to produce a uniform magnetic field in a cylindrical space between the two permanent magnet discs. The apparatus according to the invention is characterized in that in the yoke the cross-sectional area of the whole magnetic path, $A_y$, is regulated such that the following equation holds:

$$A_y = 1/a \times A_m B_m / B_{ys}$$

where $A_m$ is the cross-sectional area of magnetic path in each of the two permanent magnet discs, $B_m$ is the magnetic flux density in each of the two permanent magnet discs at normal temperature, $B_{ys}$ is the saturation magnetic flux density of the yoke at normal temperature, and a is a coefficient the value of which is not larger than 1 and not smaller than 0.6.

The merits of this invention, i.e. regulating the cross-sectional area $A_y$ of the whole magnetic path in the yoke so as to meet the above specified condition, $0.6 \leq a \leq 1$ in respect of the above equation, are summarized as follows.

The yoke does not become unnecessarily large in size, and hence a considerable reduction in the weight of the magnet apparatus can be accomplished together with a reduction in the material cost of the yoke.

Although the yoke is made relatively small in size, the magnetic field produced in the space between the two permanent magnet discs is very good in uniformity since proper care is taken to prevent magnetic saturation of the yoke which becomes a cause of leakage flux.

Since the magnet apparatus does not produce leakage flux the peripheral equipments do not suffer magnetic field interference.

DESCRIPTION OF THE PREFERRED EMBODIMENT

Figure 1:
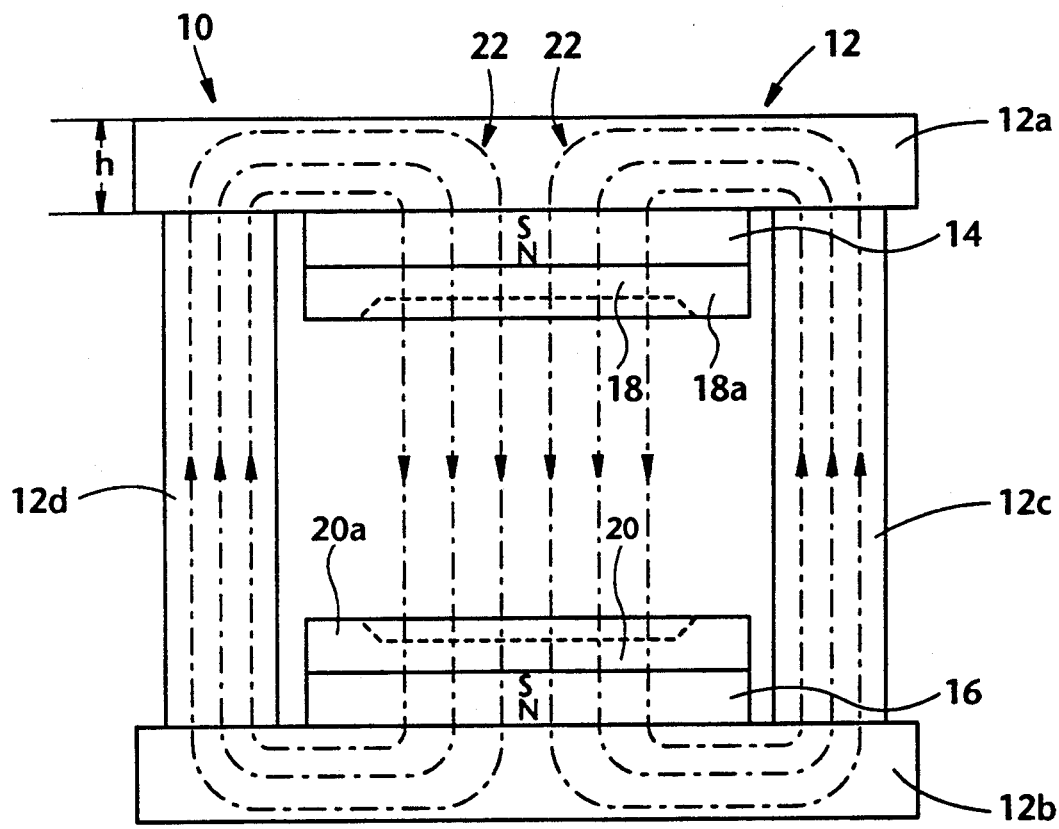
FIG. 1 is an elevational view of a magnet apparatus as an embodiment of the invention, with explanatory illustration of lines of magnetic force through the apparatus.
Figure 2:
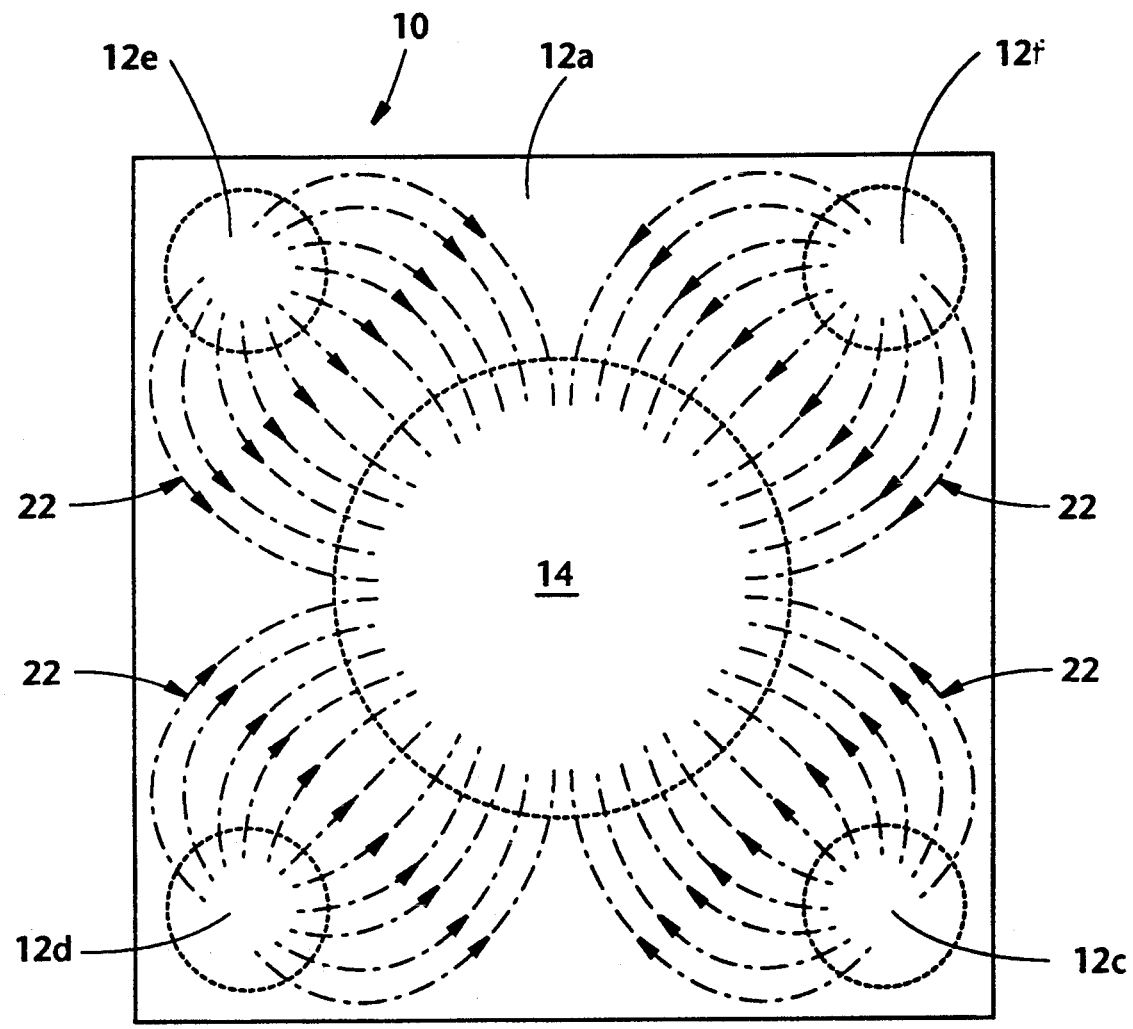
FIG. 2 is a top plan view of the apparatus of FIG. 1 with explanatory illustration of magnetic fluxes through the apparatus.

As an embodiment of the invention FIGS. 1 and 2 show a magnet apparatus 10 for producing a uniform magnetic field for MRI. The apparatus 10 has a yoke 12 and a pair of permanent magnet discs 14 and 16 each of which is magnetized in the direction of thickness. The yoke 12 is made up of top and bottom parts 12a, 12b each of which is a square plate part and four pillar parts 12c, 12d, 12e, 12f each of which is a solid cylindrical part. The top and bottom plate parts 12a and 12b are opposite and parallel to each other, and the four pillar parts 12c, 12d, 12e, 12f connect the top and bottom plates 12a and 12b in four corner regions, respectively.

The permanent magnet disc 14 is fixed to the bottom face of the upper plate part 12a of the yoke 12 and the other permanent magnetic disc 16 to the top face of the bottom plate part 12b. The two magnet discs 14 and 16 are arranged right opposite to each other in the center of the columnar space between the two square plate parts 12a and 12b, and the north pole of the magnet disc 14 faces the south pole of the opposite magnet disc 16. On the north pole face of the magnet disc 14 there is a disc-like pole piece 18 which is made of a ferromagnetic material such as soft iron and has the same diameter as the magnet disc 14. The pole piece 18 has an annular protuberance 18a in a peripheral region so as to have a suitably increased thickness in the peripheral region. Similarly, a disc-like pole piece 20 is attached to the south pole face of the magnet disc 16. The pole pieces 18, 20 are designed such that a uniform magnetic field is produced in a cylindrical space between the flat major areas of the two pole pieces 18 and 20.

In the apparatus 10 the yoke 12 serves the purpose of forming a magnetic path 22, i.e. circuit of the magnetic flux or the magnetic lines of force conceived as a "flow", that extends from the north pole face of the permanent magnet disc 16 to the south pole face of the permanent magnet disc 14. As illustrated in FIG. 1, the flow lines of magnetic fluxes produced by the permanent magnet disc 14 straightly extend to the opposite permanent magnet disc 16 and enters the bottom plate part 12b of the yoke 12. Then the flow lines of magnetic fluxes extend upward through the four pillar parts 12c, 12d, 12e, 12f of the yoke 12 to enter the top plate part 12a and return to the magnet disc 14. FIG. 2 outlines the flow lines of magnetic fluxes from the top end of each pillar part 12c, 12d, 12e, 12d of the yoke 12 into the permanent magnet disc 14 through the top plate part 12a of the yoke 12. (For the sake of simplicity, the illustration in FIG. 2 omits the extension of the magnetic lines of force into the central region of the magnet disc 14.)

In this invention the matter of important concern is the cross-sectional area of the magnetic path 22 in the yoke 12, $A_y$, in any plane normal to the direction of the magnetic flux.

The permanent magnet discs 14 and 16 are each magnetized in the direction of thickness. Therefore, in each magnet disc 14, 16 the cross-sectional area of the magnetic path, $A_m$, is equal to the cross-sectional area of the magnet disc 14, 16. That is, the cross-sectional area $A_m$ is determined by the diameter of the employed permanent magnet discs 14, 16.

In this embodiment the yoke 12 has four cylindrical pillar parts 12c, 12d, 12e, 12f to connect the two permanent magnet discs 14 and 16. Therefore, in the combination of the four pillar parts 12c, 12d, 12e, 12f the total cross-sectional area of magnetic path, $A_{y1}$, is the sum of the cross-sectional areas of the individual pillar parts.

Figure 3:
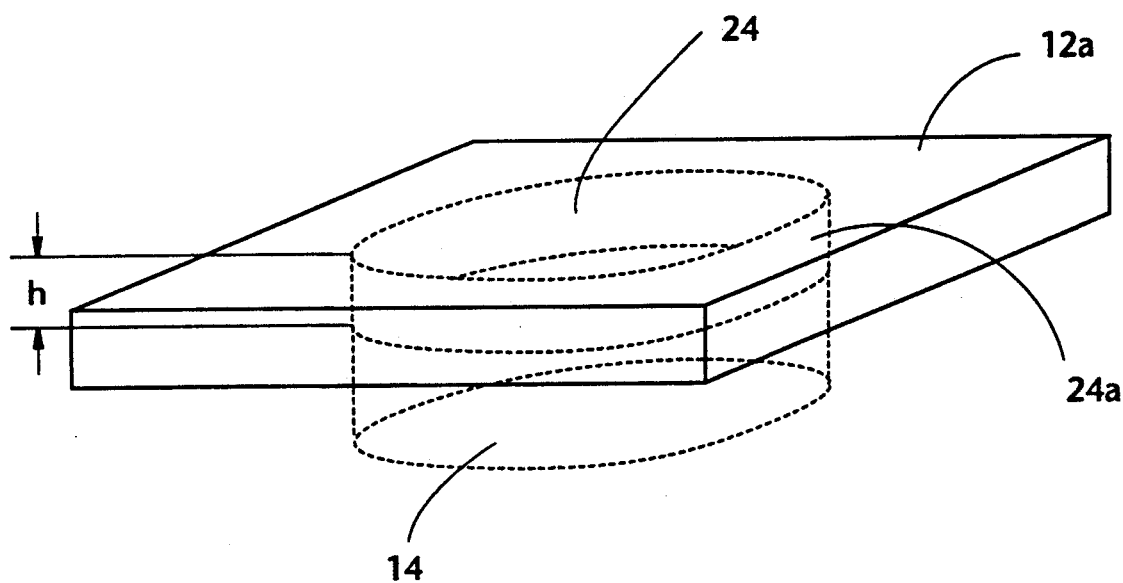
FIG. 3 is a perspective view of a part of the yoke in the apparatus of FIG. 1 and illustrates the cross-sectional area of the magnetic path in that part of the yoke.

Referring to FIG. 3, in the top plate part 12a of the yoke 12 the cross-sectional area of magnetic path, $A_{y2}$, is defined as follows. Let's suppose that in the top plate part 12a and right above the permanent magnet disc 14 there is a cylinder 24 which has the same diameter as the permanent magnet disc 14 and the same thickenss, h, as the plate part 12a. Then the area of the cylindrical side face 24a of the supposed cylinder 24 becomes the cross-sectional area $A_{y2}$ of magnetic path in the top plate part 12a of the yoke 12 since the magnetic flux density in the top plate part 12a maximizes in this cylindrical face 24a. In the bottom plate part 12b of the yoke 12 the cross-sectional area of magnetic path, $A_{y2}$, is defined in the same manner as in the top plate part 12a.

The cross-sectional areas $A_{y1}$ and $A_{y2}$ of magnetic path can be expressed by the following equations (1) and (2), respectively:

$$A_{y1} = 1/a_1 \times A_m B_m / B_{ys} \quad (1)$$

$$A_{y2} = 1/a_2 \times A_m B_m / B_{ys} \quad (2)$$

where $A_m$ is the cross-sectional area of magnetic path in each permanent magnet disc 14, 16, $B_m$ is the magnetic flux density of the permanent magnet at normal temperature, $B_{ys}$ is the saturation magnetic flux density of the yoke 12 at normal temperature, and $a_1$ and $a_2$ are arbitrary coefficients.

In the equations (1) and (2), $A_m B_m / B_{ys}$ means the minimum cross-sectional area of magnetic path in the yoke necessary for passing the whole magnetic fluxes produced by the permanent magnet discs and hence is a constant determined by the characteristics of the permanent magnet discs and the material of the yoke. Therefore, from the equations (1) and (2) it is apparent that each of the coefficients $a_1$ and $a_2$ needs to take a value not larger than 1 in order to prevent magnetic saturation of the yoke which becomes a cause of lowering of the uniformity strength of the magnetic field in the space between the two permanent magnet discs. However, if either of the coefficients $a_1$ and $a_2$ takes an unnecessarily small value the yoke becomes unnecessarily large in size.

According to the invention the cross-sectional areas $A_{y1}$ and $A_{y2}$ of magnetic path in the yoke 12 of FIGS. 1 and 2 are regulated such that both the coefficients $a_1$ and $a_2$ become not larger than 1 and not smaller than 0.6. By so regulating $A_{y1}$ and $A_{y2}$ the yoke 12 becomes fairly small in size, yet the yoke 12 can surely be prevented from magnetic saturation. Such merits of the invention are illustrated by the following experimetal results.

In the experiment, five different samples of the apparatus 10 of FIGS. 1 and 2 were produced by using a Nd-Fe-B magnet as the material of the magnet discs 14 and 16, which were 1.2 m in diameter, and a rolled carbon steel for machine structures as the material of the yoke 12. The residual magnetic flux density in the permanent magnet discs 14, 16 was 1.3 teslas, and the saturation magnetization of the carbon steel was 2.0 teslas.

In sample No. 1 the cross-sectional areas $A_{y1}$ and $A_{y2}$ of magnetic path in the yoke 12 were regulated so as to meet the conditions $0.6 \leq a_1 \leq 1$ and $0.6 \leq a_2 \leq 1$ in respect of the equations (1) and (2). In this sample the uniformity of the magnetic field was very good. That is, the degree of non-uniformity was only about 10 ppm.

In sample No. 2 the total cross-sectional area $A_{y1}$ of magnetic path in the four pillar parts 12c, 12d, 12e, 12f was regulated so as to meet the condition $0.6 \leq a_1 \leq 1$, but $A_{y2}$ in each plate part 12a, 12b was reduced so as to make the coefficient $a_2$ larger than 1. In this sample the yoke 12 became smaller in size and lighter in weight, but leakage flux appeared by reason of magnetic saturation of the yoke. Consequently the degree of non-uniformity of the magnetic field became about 300 ppm, meaning that the magnetic field was not uniform enough for MRI.

In sample No. 3, $A_{y1}$ was regulated so as to meet the condition $0.6 \leq a_1 \leq 1$, but $A_{y2}$ was enlarged so as to make the coefficient $a_2$ smaller than 0.6. In this sample the uniformity of the magnetic field was similar to that in sample No. 1, but the yoke 12 became unnecessarily large in size.

In sample No. 4 and sample No. 5, $A_{y2}$ was regulated so as to meet the condition $0.6 \leq a_2 \leq 1$. However, in sample No. 4 $A_{y1}$ was reduced so as to make the coefficient $a_1$ larger than 1, and in sample No. 5 $A_{y1}$ was enlarged so as to make the coefficient $a_1$ smaller than 0.6. Consequently, sample No. 4 was unsatisfactory in the uniformity of the magnetic field, and sample No. 5 was unnecessarily large in the size of the yoke 12.

In the embodiment shown in FIGS. 1 and 2 the yoke 12 is made up of two plate parts 12a, 12b and four cylindrical pillar parts 12c, 12d, 12e, 12f, but this is a mere example. It is a matter of course that in an apparatus according to the invention the construction and configuration of the yoke can widely be modified.

What is claimed is:

1. A magnet apparatus suitable for magnetic resonance imaging, the apparatus having a pair of permanent magnet discs each of which is magnetized in the direction of thickness, a yoke which connects said pair of permanent magnet discs and holds the permanent magnet discs parallel and opposite to each other such that a pole face of one of the permanent magnet discs faces the opposite pole face of the other and a pair of disc-like pole pieces which are placed on the opposite pole faces of said pair of permanent magnet discs, respectively, so as to produce a uniform magnetic field in a cylindrical space between the two permanent magnetic discs, characterized in that in said yoke the cross-sectional area of the whole magnetic path, $A_y$, is regulated such that the following equation holds:

$$A_y = 1/a \times A_m B_m / B_{ys}$$

where $A_m$ is the cross-sectional area of magnetic path in each of said pair of permanent magnet discs, $B_m$ is the magnetic flux density in each of said permanent magnet discs at normal temperature, $B_{ys}$ is the saturation magnetic flux density of said yoke at normal temperature, and a is a coefficient the value of which is not larger than 1 and not smaller than 0.6.

2. An apparatus according to claim 1, wherein said yoke comprises a pair of plate parts to which said pair of permanent magnet discs are fixed, respectively, and a plurality of parallel pillar parts which are positioned outside the circumferences of said permanent magnet discs and connect said pair of plate parts.

3. An apparatus according to claim 2, wherein each of said plurality of parallel pillar parts is a solid cylindrical pillar part.

4. An apparatus according to claim 3, wherein the number of said plurality of pillar parts is 4.

* * * * *